(12) United States Patent
Lucas et al.

(10) Patent No.: US 7,962,868 B2
(45) Date of Patent: Jun. 14, 2011

(54) METHOD FOR FORMING A SEMICONDUCTOR DEVICE USING OPTICAL PROXIMITY CORRECTION FOR THE OPTICAL LITHOGRAPHY

(75) Inventors: Kevin Lucas, Meylan (FR); Robert Boone, Grenoble (FR); Karl Wimmer, Venon (FR); Christian Gardin, Lancey (FR)

(73) Assignee: Freescale Semiconductor, Inc., Austin, TX (US)

( * ) Notice: Subject to any disclaimer, the term of this patent is extended or adjusted under 35 U.S.C. 154(b) by 506 days.

(21) Appl. No.: 12/091,695

(22) PCT Filed: Oct. 28, 2005

(86) PCT No.: PCT/EP2005/013520
§ 371 (c)(1),
(2), (4) Date: Apr. 25, 2008

(87) PCT Pub. No.: WO2007/048442
PCT Pub. Date: May 3, 2007

(65) Prior Publication Data
US 2008/0295060 A1    Nov. 27, 2008

(51) Int. Cl.
G06F 17/50 (2006.01)
G06K 9/00 (2006.01)
G06K 9/64 (2006.01)

(52) U.S. Cl. ............... 716/54; 716/50; 716/51; 716/52; 716/53; 716/55; 382/145; 382/279

(58) Field of Classification Search ............ 716/19, 716/20, 21; 382/145, 279
See application file for complete search history.

(56) References Cited

U.S. PATENT DOCUMENTS

| | | | |
|---|---|---|---|
| 5,326,659 A | 7/1994 | Liu et al. | |
| 5,705,301 A | 1/1998 | Garza et al. | |
| 6,077,310 A | 6/2000 | Tamamoto et al. | |
| 6,081,658 A | 6/2000 | Rieger et al. | |
| 6,214,494 B1 * | 4/2001 | Bula et al. | 430/5 |
| 6,584,609 B1 | 6/2003 | Pierrat et al. | |
| 6,665,856 B1 * | 12/2003 | Pierrat et al. | 716/53 |
| 6,720,565 B2 * | 4/2004 | Innes et al. | 250/492.22 |
| 6,765,651 B1 * | 7/2004 | Fiekowsky et al. | 355/77 |
| 6,912,323 B2 * | 6/2005 | Copeland et al. | 382/279 |
| 6,978,438 B1 * | 12/2005 | Capodieci | 716/21 |

(Continued)

FOREIGN PATENT DOCUMENTS

EP    1582934 A    10/2005

(Continued)

OTHER PUBLICATIONS

Liu et al., "Inverse Lithography Technology Principles in Practice; Unintuitive Patterns," 2005 Proceedings of the SPIE, vol. 5992, pp. 886-893.

(Continued)

*Primary Examiner* — Helen Rossoshek

(57) ABSTRACT

A method for forming a semiconductor device includes performing a first optimization of a first edge location of a feature fragment, wherein the first optimization has a first speed per fragment, and performing a second optimization of a second edge location of the feature fragment, wherein the second optimization has a second speed per fragment that is slower than the first speed per fragment. Next, a result of the second optimization is used to form a reticle pattern; and a layer on a semiconductor wafer is patterned using the reticle pattern.

20 Claims, 1 Drawing Sheet

U.S. PATENT DOCUMENTS

| | | | |
|---|---|---|---|
| 7,010,776 B2 * | 3/2006 | Gallatin et al. | 716/19 |
| 7,256,910 B2 * | 8/2007 | Lee | 358/1.9 |
| 7,266,803 B2 * | 9/2007 | Chou et al. | 716/21 |
| 7,512,927 B2 * | 3/2009 | Gallatin et al. | 716/51 |
| 7,562,319 B2 * | 7/2009 | Pierrat et al. | 716/4 |
| 7,747,978 B2 * | 6/2010 | Ye et al. | 716/50 |
| 7,788,630 B2 * | 8/2010 | Li et al. | 716/21 |
| 2002/0083408 A1 | 6/2002 | Haffner et al. | |
| 2002/0133801 A1 | 9/2002 | Granik et al. | |
| 2002/0188925 A1 | 12/2002 | Higashi | |
| 2003/0140330 A1 | 7/2003 | Tanaka et al. | |
| 2004/0122636 A1 * | 6/2004 | Adam | 703/2 |
| 2005/0055658 A1 | 3/2005 | Mukherjee et al. | |
| 2005/0076321 A1 * | 4/2005 | Smith | 716/19 |
| 2005/0081179 A1 | 4/2005 | Melvin, III | |
| 2005/0185159 A1 * | 8/2005 | Rosenbluth et al. | 355/53 |
| 2007/0209029 A1 * | 9/2007 | Ivonin et al. | 716/19 |
| 2008/0077907 A1 * | 3/2008 | Kulkarni | 716/20 |
| 2009/0070730 A1 * | 3/2009 | Zhang et al. | 716/19 |
| 2009/0185740 A1 * | 7/2009 | Tirapu-Azpiroz et al. | 382/145 |
| 2009/0193387 A1 * | 7/2009 | Mukherjee et al. | 716/21 |
| 2010/0153904 A1 * | 6/2010 | Zhang | 716/21 |
| 2010/0229147 A1 * | 9/2010 | Ye et al. | 716/19 |

FOREIGN PATENT DOCUMENTS

| | | |
|---|---|---|
| EP | 1584980 A | 10/2005 |
| EP | 1329771 B1 | 9/2006 |
| WO | 2005073807 A | 8/2005 |
| WO | 2007048442 A | 5/2007 |

OTHER PUBLICATIONS

Word et al., "Enhanced Model-based OPC for 65nm and Below," 21st European Mask and Lithography Conference, Jan. 31-Feb. 3, 2005, vol. 5835, Dresden, Germany, pp. 49-58.

\* cited by examiner

FIGURE
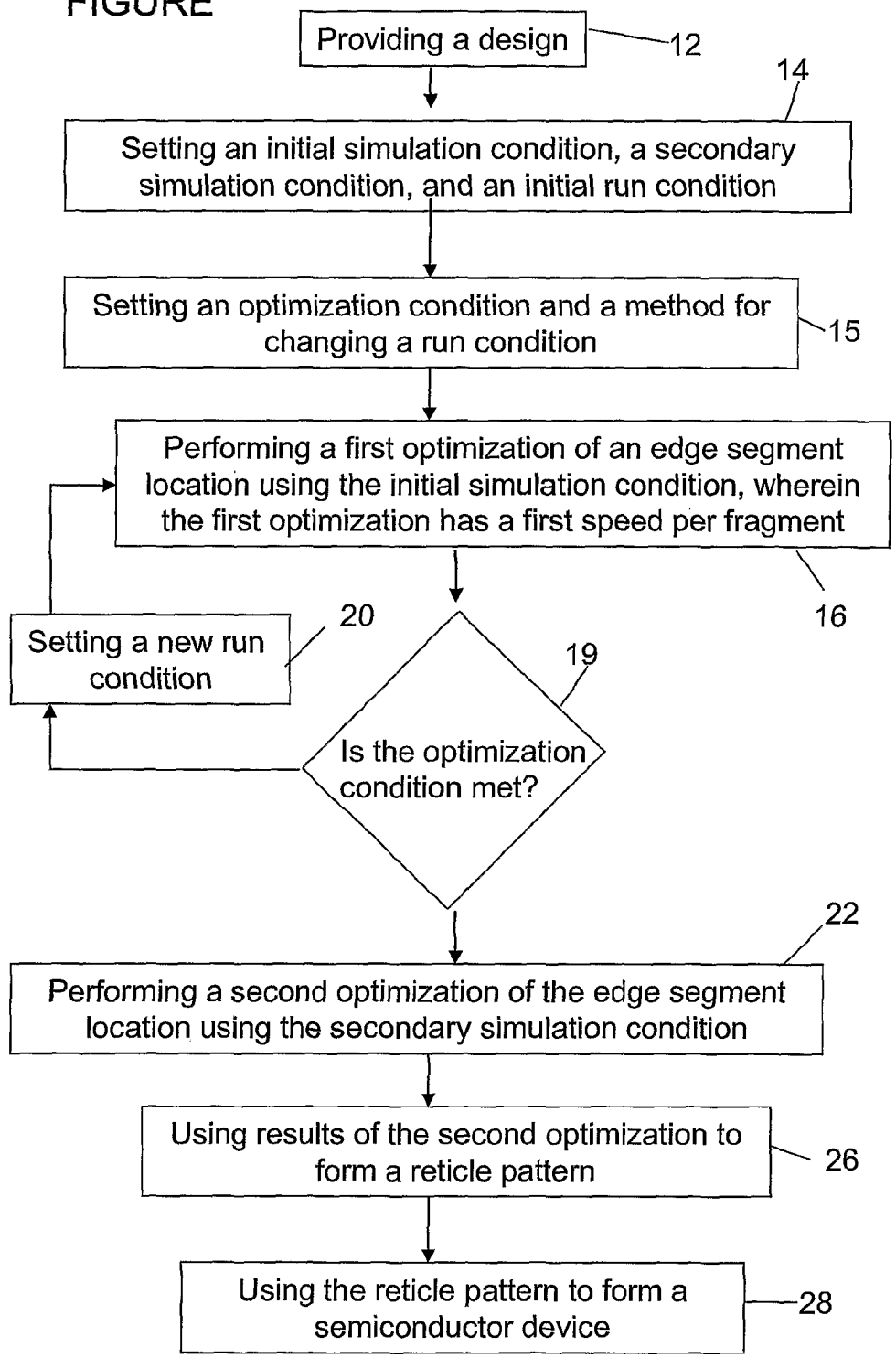

METHOD FOR FORMING A SEMICONDUCTOR DEVICE USING OPTICAL PROXIMITY CORRECTION FOR THE OPTICAL LITHOGRAPHY

FIELD OF THE INVENTION

This invention relates generally to forming a semiconductor device and more specifically to forming a semiconductor device using optical proximity correction.

BACKGROUND OF THE INVENTION

When making an integrated circuit (which may also be referred to as a chip or device), photolithography is used to transfer features from a reticle or mask to a semiconductor wafer. Since photolithography is typically not able to faithfully reproduce the reticle design on the wafer, the reticle design is adjusted or optimized so that the features on the semiconductor wafer are created at the desired dimensions. To determine and form the optimized reticle design, the area around a feature on the reticle design must be considered. Techniques such as optical proximity correction (OPC) may be used. The OPC procedure is used to compensate for such optical effects as diffraction, for instance. Such effects may lead to rounded corners of features on the final silicon wafer or to a reduction in gaps between adjacent features which are outside of process tolerances. The optical influence that features have on their neighbours falls off rapidly as the distance between the features increases.

The OPC procedure is usually carried out after the design and layout of the integrated circuit has been determined and so is carried out as one of the final steps before the reticle is produced. The OPC procedure is typically carried out using a powerful computer system. Execution times range from several hours to several days depending on the size of the design and the computing power available.

The OPC stage may include a rule based procedure, for instance. Such rules may enlarge the ends of tracks to form hammerheads and extend the outer portions of corners while reducing the inner portions, for instance. Model based techniques may also follow. These simulate the resultant optical image formed by the reticle exposure onto the wafer and iteratively correct any difference between the simulated and the desired wafer images. Normally, model based OPC run parameters are defined and then several iterations of OPC calculations are required in order to sufficiently optimize a reticle design, i.e. such that features on the semiconductor wafer are created at the correct dimensions. Unfortunately, the run time increases linearly with the number of OPC iterations.

The reticle design after completion of OPC optimization is typically analyzed or simulated to ensure that the OPC has been performed correctly. If an error in the reticle design after OPC is detected, model based OPC run parameters may be changed manually and a new OPC job started. For each different OPC job run, the OPC calculations are restarted with the original design as the staring point for the OPC iterations. Thus, if one line edge is moved outwards to enlarge a feature in the first OPC job, the second OPC job is begun with this edge unmoved (i.e., without the feature enlarged). There is no methodology to reuse the edge location of the edge that was previously moved in the first OPC job. Instead, each OPC job is begun from the same original design. This process increase the overall time required to obtain correct OPC results.

As the OPC procedure must be carried out at the end of the design stage, the computer runtime used to perform it adds to the overall delivery time of the final integrated circuit. As the need to increase the number of features on an integrated circuit grows, so too will the OPC calculation runtime. The execution runtime problem will continue to get worse as OPC calculations must be carried out on current computers, which must be used to optimize tomorrow's processors.

It is therefore desirable to provide a method for making an integrated circuit that minimizes the overall time required for OPC optimization.

SUMMARY OF THE INVENTION

The present invention provides a method for forming a semiconductor device as described in the accompanying claims.

BRIEF DESCRIPTION OF THE DRAWINGS

The FIGURE is a flow chart illustrating a method for forming a semiconductor device in accordance with one embodiment of the invention, given by way of example.

DETAILED DESCRIPTION OF THE PREFERRED EMBODIMENTS

In one embodiment, a design used to form a semiconductor device is iteratively tested using a speed optimized model to determine optimum OPC input conditions. Afterwards a final, more accurate model is run. The final, more accurate model may also include iterative processing. This approach decreases the run time of the OPC process.

The FIGURE shows a flow chart describing a method 10 for making a semiconductor device (or integrated circuit) according to one aspect of the present invention. The flow chart does not show all of the steps for making the semiconductor device but these remaining steps will be familiar to the skilled person. The process starts with providing 12 a design used to form the semiconductor device. In one embodiment, the design includes a layout of all of the gate electrodes that will be formed on a semiconductor substrate or wafer.

Next, an initial simulation condition, a secondary simulation condition, and an initial run condition are set 14. The initial simulation condition, the secondary simulation condition, and the initial run conditions, each may be one or more conditions. The initial simulation condition includes the optical and process models used to simulate aerial images at the semiconductor wafer and a prediction of the wafer pattern as would be printed on the semiconductor wafer with the reticle design. In one embodiment, the aerial images can be simulated by performing convolutions of the reticle design and convolution kernels which approximate the lithographic imaging system and the resist chemical diffusion. A convolution kernel is a spatial function in two dimensions which when convolved with an input spatial pattern describes how the input spatial pattern is modified by a system to become the output spatial pattern. For a lithographic imaging system multiple convolutions may be used to describe how a spatial light pattern at the reticle is modified to become the output spatial pattern on the wafer.

The secondary simulation condition also includes the optical and process models used to create the simulated aerial image at the semiconductor wafer and a prediction of the wafer pattern as would be printed on the semiconductor wafer with the reticle design. In one embodiment, the initial or secondary simulation conditions are the number of convolution kernels used to predict the aerial image at the semiconductor wafer, the spatial form of the convolution kernels, the radius of the convolution kernels, and the mathematical form of the aerial image threshold function used to predict the wafer pattern as would be printed on the semiconductor wafer. The initial run condition includes a discretization condition, a movement condition, or a combination of the above. Discretization conditions are rules or methods for breaking the design into discrete edge segments and for locating discrete sites at which to simulate the aerial image for the semiconductor wafer. A movement condition includes rules or methods for allowed movement of the discrete edge segments during a subsequent optimization process. Thus, the initial run condition, in one embodiment, includes the rules or methods of breaking the design into segments, and moving of the segments to optimize the design. The initial simulation condition, the secondary simulation condition, and the initial run condition, can be determined using a model-based OPC software, such as that sold by Mentor Graphics® headquartered in Wilsonville, Oreg. or Synopsys, Inc. headquartered in Mountain View, Calif.

After setting the simulation conditions and the initial run conditions 14, an optimization condition and a method of changing a run condition is optionally set 15. In one embodiment, the optimization condition is an error condition and thus, the optimization condition is met if no errors are present. In another embodiment, the optimization condition is a number of different run conditions and thus, the optimization condition is met if all of the different run conditions have been tested. In the one embodiment, the method of changing run conditions is performed by selecting a run condition from a predetermined list, which in one embodiment is a prioritized list. In another embodiment, the method of changing run conditions is a heuristic method which uses simulation results to optimize parameters of the run conditions such as optimal length of discrete edge segments. A heuristic method involves using an algorithm with a desirable run time, where the method results in a satisfactory or optimal solution.

After setting 14 the initial run conditions and setting 15 the optimization condition and a method for changing the run conditions, if performed, a first optimization of an edge segment location is performed 16 using the initial simulation condition and the initial run condition. The first optimixation includes an optimization of one or more edge segment locations. In one embodiment, the first optimization of the edge segment location involves a number of OPC iterations. Each iteration uses the location of a edge segment determined by the previous iteration and, if applicable, modifies this location. For example, if after a first iteration a first segment is moved to a first distance, the second iteration uses the new location of the first segment and may move the first segment to a second distance. In one embodiment, the segment movements are moved not only perpendicular to the original feature, but also in other directions; for example, they can be moved parallel to the original features. Furthermore, the same direction of movement does not need to be used for each iteration.

After performing 16 the initial segment optimization, an optional test of goodness may be performed. During the test, if performed, a decision 19 is made as to whether or not the optimization condition is met.

If the optional test of optimization conditions is performed and the optimization condition is not met, then an initial run condition is changed 20 using a predetermined method to create a new run condition, which may be one or more conditions. For example, the predetermined method could be selected from a prioritized list of run conditions to test. The new run condition, like the initial run condition, includes a discretization condition, a movement condition, or a combination of the above. The discretization condition, the movement condition, or both are likely to be different in the initial run conditions than in the new run conditions. The new run condition and the initial simulation condition are then used to repeat performing 16 the first optimization until the optimization condition is met. In one embodiment, the initial run condition includes a larger predetermined minimum discrete edge segment length than the new run condition. In other words, the initial run condition includes a first predetermined minimum discrete edge segment length and the new run condition includes a second predetermined minimum segment length, which is smaller than the first minimum segment length. In another embodiment, the new run condition includes the different predetermined minimum discrete edge segment length but also different predetermined minimum feature to feature space limits. In one embodiment, the initial run condition includes a first predetermined minimum feature to feature space limit and the new run conditions includes a second predetermined minimum feature to feature space limit which is smaller than the first predetermined minimum feature to feature space limit. In other words, each time the first optimization is performed 16 a different set of predetermined run conditions to optimize the segment locations is used. In one embodiment, all feature segments in the design are optimized during each subsequent segment optimization. In another embodiment, only those feature segments that are influenced by the OPC of features that do not meet the optimization condition are optimized each time the first optimization is performed 16. In one embodiment, when the first optimization is performed again it is performed only on a subset of original features within the design. This subset is influenced by the OPC of features that do not meet the first optimization condition. The time required to perform 16 the first optimization of the segment locations is a function of the number of segments, the time required for the simulation, and the number of iterations. For example, the number of segments may be more than 1 million. The time required for the optimization of the more than 1 million segment locations is approximately 1 hour to 1 day. In the prior art, the number of iterations is typically between 4 and 10 and the same simulation conditions are used for each of the iterations. In contrast, the method 10 involves using one set of simulation conditions for each iteration of the first optimization process and also using a second set of simulation conditions for each iteration of a subsequent second optimization process, which is described below. Unlike the prior art, as will be better understood with further explanation, there are at least two optimization processes. While the total number of iterations for both the first and second optimization processes may be between 4 to 10 iterations, the total number of iterations will be split between the first and second optimization processes and the second optimization process may have less iterations than the first optimization process. For example, in the prior art the number of iterations performed during the single optimization process may be 5 and in the method 10 the first optimization process may include 4 iterations and the second optimization process may include 1 iteration.

After the first optimization of segment locations is completed with the initial simulation condition, a second optimization is performed 22 to further optimize the edge segment location using the secondary simulation condition. The second optimization may optimize one or more edge segment locations. In one embodiment, the second optimization involves a number of OPC iterations. Each iteration uses the location of an edge segment determined by the previous iteration and, if applicable, modifies this location. For example, if after a first iteration a first segment is moved out to a first distance, the second iteration uses the new location of the first segment and may move the first segment to a second distance. In one embodiment, the segment movements are moved not only perpendicular to the original feature, but also in other directions; for example, they can be moved parallel to the original features. Furthermore, the same direction of movement does not need to be used for each iteration.

The second optimization 22 differs from the first optimization 16 in that the second optimization 22 is performed using the secondary simulation condition. The secondary simulation condition differs from the initial simulation condition in the theoretical simulation accuracy and in the simulation time required during the optimization of a segment location. In one embodiment, the secondary simulation condition has a larger convolution kernel radius than the initial simulation condition. Therefore, the initial simulation condition has lower accuracy and requires less simulation time per fragment than the secondary simulation condition. In another embodiment, the secondary simulation condition has a larger convolution kernel radius than the initial simulation condition and the secondary simulation condition has a higher number of convolution kernels than the initial simulation condition. Therefore, the initial simulation condition has lower accuracy and requires less simulation time per fragment than the secondary simulation condition. In yet another embodiment, the initial simulation condition utilizes one or more convolution kernels which are designed to accurately predict the location of optical ringing on the wafer due to interference effects in strong off axis lithographic illumination, whereas the secondary simulation condition utilizes only standard convolution kernels designed to accurately simulate the entire lithographic imaging system. In this embodiment, the accuracy of the initial simulation condition is lower overall but higher for a specific simulation purpose. The initial simulation condition again requires less simulation time than the secondary simulation condition. Thus, in all embodiments the initial simulation condition requires less simulation time per fragment, than the secondary simulation condition and therefore, the second optimization has a slower speed per fragment than the first optimization.

After forming the second optimization process, an optional testing (not shown) can be performed to determine if there are any errors or rule violations in the design after the second optimization process. Then, results of the second optimization process is used 26 to form a reticle pattern using conventional processing. The reticle pattern is then used 28 to form a semiconductor device using conventional processing. In one embodiment, the reticle pattern is used in a photolithographic process to pattern a photoresist layer on a semiconductor wafer so device features can be formed.

By now it should be appreciated that there has been provided a method of forming a semiconductor device using the method that optimizes a design, particularly for optical proximity correction. The method minimizes the overall time required for OPC optimization.

In the foregoing specification, the invention has been described with reference to specific embodiments. However, one of ordinary skill in the art appreciates that various modifications and changes can be made without departing from the scope of the present invention as set forth in the claims below. For example, a skilled artisan should recognize that different hardware (e.g., computers) can be used for different processes of method 10. For example, a first computer can be used for the first optimization process and a second computer can be used for the second optimization process. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one.

The invention claimed is:

1. A method for forming a semiconductor device, the method comprising:
    performing a first optimization of a first edge location of a feature fragment, wherein the first optimization has a first speed per fragment;
    performing a second optimization of a second edge location of the feature fragment, wherein:
        the second edge location is part of a result of the first optimization;
        the second optimization is performed after the first optimization; and
        the second optimization has a second speed per fragment that is slower than the first speed per fragment;
    using a result of the second optimization to form a reticle pattern; and
    using the reticle pattern to form a device feature over a semiconductor wafer.

2. The method of claim 1, further including:
    setting an initial run condition, a first simulation condition, and a second simulation condition, wherein the initial run condition and the first simulation condition are used in performing the first optimization;
    setting an optimization condition prior to performing the first optimization;
    determining if the optimization condition is met after performing the first optimization;
    when the optimization condition is not met, setting a new run condition, wherein the new run condition and the first simulation condition are used in performing the first optimization; and
    when the optimization condition is met, using the new run condition and the second simulation condition in performing the second optimization.

3. The method of claim 2, wherein the initial run condition is selected from the group consisting of a first movement condition and a first discretization condition.

4. The method of claim 2, wherein the optimization condition is an error condition.

5. The method of claim 2, wherein setting a new run condition includes choosing a new run condition from a predetermined list of run conditions.

6. The method of claim 2, wherein the second optimization has a slower run time than the first optimization.

7. The method of claim 2, wherein one of the first optimization and the second optimization includes moving fragment edges parallel to the edge of the feature.

8. The method of claim 2, wherein the first optimization includes a first predetermined number of iterations and the second optimization includes a second predetermined number of iterations.

9. The method of claim 8, wherein the first predetermined number is greater than the second predetermined number.

10. The method of claim 2, wherein the first simulation condition is selected from a group consisting of a first optical model radius, and a first number of simulation kernels, and the second simulation condition is selected from the group consisting of a second optical model radius, and a second number of simulation kernels, wherein the first optical model radius is different than the second optical model radius, and the first number of simulation kernels is different than the second number of simulation kernels.

11. The method of claim 1, wherein the second optimization has a slower run time than the first optimization.

12. The method of claim 11, wherein one of the first optimization and the second optimization includes moving fragment edges parallel to the edge of the feature.

13. The method of claim 12, wherein the first simulation condition is selected from a group consisting of a first optical model radius, and a first number of simulation kernels, and the second simulation condition is selected from the group consisting of a second optical model radius, and a second number of simulation kernels, wherein the first optical model radius is different than the second optical model radius, and the first number of simulation kernels is different than the second number of simulation kernels.

14. The method of claim 11, wherein the first simulation condition is selected from a group consisting of a first optical model radius, and a first number of simulation kernels, and the second simulation condition is selected from the group consisting of a second optical model radius, and a second number of simulation kernels, wherein the first optical model radius is different than the second optical model radius, and the first number of simulation kernels is different than the second number of simulation kernels.

15. The method of claim 1, wherein one of the first optimization and the second optimization includes moving fragment edges parallel to the edge of the feature.

16. The method of claim 15, wherein the first optimization includes a first predetermined number of iterations and the second optimization includes a second predetermined number of iterations.

17. The method of claim 1, wherein the first optimization includes a first predetermined number of iterations and the second optimization includes a second predetermined number of iterations.

18. The method of claim 17, wherein the first predetermined number is greater than the second predetermined number.

19. The method of claim 1, wherein the first simulation condition is selected from a group consisting of a first optical model radius, and a first number of simulation kernels, and the second simulation condition is selected from the group consisting of a second optical model radius, and a second number of simulation kernels, wherein the first optical model radius is different than the second optical model radius, and the first number of simulation kernels is different than the second number of simulation kernels.

20. The method of claim 19, wherein the first optimization includes a first predetermined number of iterations and the second optimization includes a second predetermined number of iterations.

* * * * *